(12) United States Patent
Sebastian et al.

(10) Patent No.: US 9,006,712 B2
(45) Date of Patent: Apr. 14, 2015

(54) ORGANIC MEMORY ELEMENT

(75) Inventors: Philipp Sebastian, Dresden (DE); Bjoern Luessem, Dresden (DE); Karl Leo, Dresden (DE)

(73) Assignee: Novaled AG, Dresden (DE)

( * ) Notice: Subject to any disclaimer, the term of this patent is extended or adjusted under 35 U.S.C. 154(b) by 148 days.

(21) Appl. No.: 13/275,963

(22) Filed: Oct. 18, 2011

(65) Prior Publication Data
US 2012/0235122 A1 Sep. 20, 2012

(30) Foreign Application Priority Data
Mar. 16, 2011 (DE) .......................... 10 2011 014 657

(51) Int. Cl.
*H01L 51/30* (2006.01)
*B82Y 30/00* (2011.01)
*H01L 51/05* (2006.01)
*B82Y 10/00* (2011.01)
*H01L 51/00* (2006.01)

(52) U.S. Cl.
CPC ............. *H01L 51/0591* (2013.01); *B82Y 30/00* (2013.01); *H01L 51/0046* (2013.01); *H01L 51/0053* (2013.01); *H01L 51/0077* (2013.01); *H01L 51/0081* (2013.01); *H01L 2251/308* (2013.01); *B82Y 10/00* (2013.01); *Y10S 977/943* (2013.01)

(58) Field of Classification Search
CPC ..... H01L 51/00; H01L 51/32; H01L 51/0045; H01L 51/0046; H01L 51/0591; H01L 45/04; G11C 13/0014; G11C 11/5664
USPC .................... 257/40, 642, E39.007, E51.001, 257/E51.002; 977/943; 438/82
See application file for complete search history.

(56) References Cited

U.S. PATENT DOCUMENTS

| 7,035,140 | B2 * | 4/2006 | Jackson et al. ................. 365/174 |
| 2005/0040390 | A1 | 2/2005 | Pfeiffer et al. | |
| 2005/0224922 | A1 * | 10/2005 | Lyons ............................ 257/642 |
| 2007/0197768 | A1 * | 8/2007 | Choi et al. ..................... 528/395 |
| 2008/0227979 | A1 | 9/2008 | Saalbeck et al. | |
| 2010/0135073 | A1 * | 6/2010 | Lindner et al. ................ 365/174 |

OTHER PUBLICATIONS

Lindner et al., 2008, "Organic Heterostructure Device with Nonvolatile Memory Behavior using Electrically Doped Layers," Applied Physics Letters, 93:233305-1:-3.
Naber et al., 2010, "Organic Nonvolatile Memory Devices Based on Ferroelectricity," Advanced Materials, 22:933-945.
Potember et al., 1979, "Electrical Switching and Memoy Phenoma in Cu-TCNQ thin Thin Films," Applied Physics Letters, 34(6):405-407.
Scott et al., 2007, "Nonvolatile Memory Elements Based on Organic Materials," Adv. Mater. 2007, 19, 1452-1463.
Tu et al., 2006, "Memory Effect in the Current-Voltage Characteristic of 8-Hydroquinoline Aluminum Salt Films," IEEE Electron Device Letters, 27(5):354-356.
Walzer at al., 2007, "Highly Efficient Organic Devices Based on Electrically Doped Transport Layers," Chem. Rev. 107:1233-1271.

* cited by examiner

*Primary Examiner* — Tom Thomas
*Assistant Examiner* — John Bodnar
(74) *Attorney, Agent, or Firm* — Sutherland Asbill & Brennan LLP

(57) ABSTRACT

The invention relates to an organic memory with an electrode and a counter-electrode, comprising at least one oxide layer, an electrically undoped organic layer and an electrically doped organic layer between the electrode and the counter-electrode, wherein the oxide layer is adjacent to the electrode and the undoped organic layer.

8 Claims, 10 Drawing Sheets

ORGANIC MEMORY ELEMENT

CROSS-REFERENCE TO RELATED APPLICATIONS

This application hereby claims priority to German Patent Application No. 10 2011 014 657.1, filed 16 Mar. 2011, the disclosures of which are expressly incorporated herein by reference in their entirety.

FIELD OF THE INVENTION

This specification relates to an organic memory element.

BACKGROUND OF THE INVENTION

Various concepts for the storage of information with the aid of organic layers are discussed in the scientific literature W. The formulations range from ferroelectric layers [2] and memories based on metallic filaments [1,3] to memories comprising donor-acceptor complexes [4]. Despite the large number of publications in the field, the precise functional mechanism of the memories is nevertheless unknown in many cases and the reproducibility and cycle stability is severely limited.

Previously, organic memory elements sometimes suffered from low cycle stability. Furthermore, the design of previous organic memory elements made them relatively costly to produce. An organic memory element that overcomes one of these disadvantages or other disadvantages known in the art would be desirable.

SUMMARY OF THE INVENTION

The object of the invention is to provide an improved memory element.

The invented organic memory contains an electrode and a counter-electrode and is characterized in that there is at least one oxide layer, an electrically undoped organic layer and an electrically doped organic layer between the electrode and the counter-electrode, wherein the oxide layer is adjacent to the electrode and the undoped organic layer.

DETAILED DESCRIPTION

The oxide layer is responsible in conjunction with the undoped organic layer for the emergence of hysteresis. It is believed that the function of the oxide layer is to store charge carriers in trapping states. Oxides that display high densities of trapping states could be better suitable. The characteristics of trapping states are favoured by the nanoporosity in oxides.

The electrically undoped organic layer is an organic layer that acts as an interface with the oxide as a memory layer for charge carriers. The layer is preferably made from an electron-accepting organic material. The electrically undoped layer can comprise a mixture of more than one material, as long as no compounds in the mixture form an electrically doped system.

The electrically doped organic layer comprises an organic layer that is doped with another organic molecule or atom. By means of the doped layer, charge carriers can be effectively injected into the undoped organic layer. Electrical losses can be avoided during the charge carrier injection. The advantages of doping and the description of the doping of organic layers are documented in the literature and also in patents.

The energy level (LUMO) of the undoped organic layer is lower than the energy level of the doped organic layer (Eorg., undop<Eorg,dop), just to make the relation clear, for example −4 eV is lower than −3.5 eV. The energy level of the oxide conduction band is higher than the energy level of the undoped organic layer (Eoxide, CB>Eorg,undop).

Figure 11:
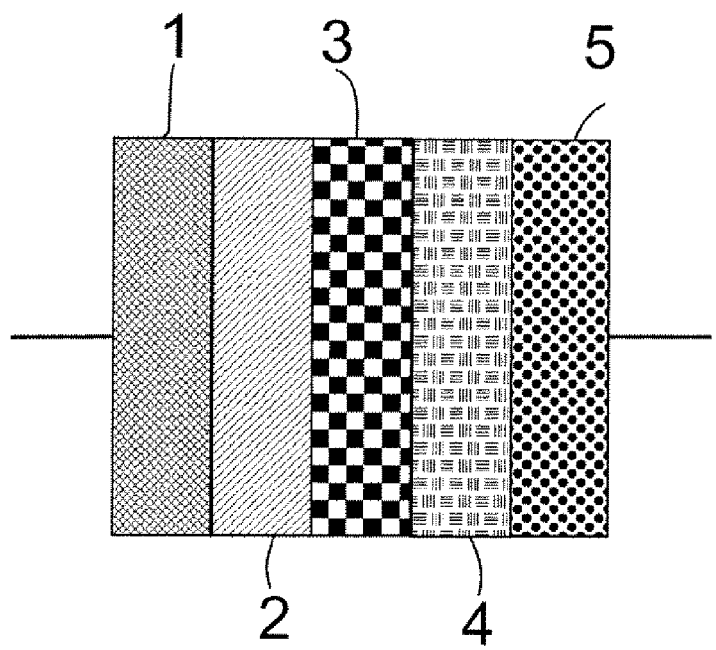
FIG. 11 General layer sequence of the organic memory element.

The general layer sequence of the organic memory element is illustrated in FIG. 11.

The organic memory according to this invention is an electronic device which exhibits a hysteresis upon cycling the voltage from zero to a certain positive voltage.

The counter-electrode is set to ground and voltage is applied to the electrode. The application of a positive voltage leads to electron injection via the top electrode and is referred as forward direction of the electronic device. The hysteresis is large enough to provide a current ratio (ON/OFF ratio) of at least 2 on a pre-determined reading voltage.

Oxide Layer:

The oxide layer may consist of a metal oxide, a transitional metal oxide or a semi-metal oxide. Preferable oxides are selected from HfO2, SiO2, Al2O3.

One side of oxide layer directly contacts one side of the electrode; the other side of the oxide layer directly contacts the undoped organic layer. In other words, the electrode, oxide layer, and the undoped organic layer are formed in sequence as a stack of layers.

The oxide layer is an insulator, meaning that materials such as TCOs (transparent conductive oxides) or purposeful doped oxide layers are excluded.

Electrical Doping:

The electrical doping can also be called redox-doping or charge transfer doping. It is known that the doping increases the density of charge carriers of a semiconducting matrix [6] towards the charge carrier density of the undoped matrix. An electrically doped semiconductor layer also has an increased effective mobility in comparison with the undoped semiconductor matrix.

US2008227979 discloses in detail the doping of organic transport materials, also called matrix, with inorganic and with organic dopants. Basically, an effective electronic transfer occurs from the dopant to the matrix increasing the Fermi level of the matrix.

Rules for doping (those are not binding but help the skilled in the art to reproduce the invention): for an efficient transfer in a p-doping case, the LUMO energy level of the dopant is preferably more negative than the HOMO energy level of the matrix or at least slightly more positive, typically not more than 0.5 eV, to the HOMO energy level of the matrix. For the n-doping case, the HOMO energy level of the dopant is preferably more positive than the LUMO energy level of the matrix or at least slightly more negative, typically not lower than 0.5 eV, to the LUMO energy level of the matrix. It is further more desired that the energy level difference for energy transfer from dopant to matrix is smaller than +0.3 eV.

When a single element, such as a metal is used as a dopant, metals with low ionization potential are suitable as a ndopant. Alkali metals such as e.g. Cs fulfil this requirement. Also entirely organic semiconducting materials can be used as doping layer within the device stack of the organic memory. Organic memory devices comprising the organic n-dopant W2(hpp)4 exhibit memory behaviour, too. 2,4,7,9-tetraphenyl-1,10-phenanthroline doped (TPPhen) with W2(hpp)4 or C60 doped with W2(hpp)4 have been successfully tested, wherein the better results were obtained with TPPhen, likely due to the barrier between TPPhen and the electrically undoped organic layer. Memory devices embody C60 and its fullerene derivate C70 showed memory performance. Fullerenes can be used as organic semiconducting material within the device stack. Fullerenes are preferred over other organic materials (MePTCDi, pentacene, etc.) due to the better performance.

Examples of fullerenes are: C50, C60, C70, C76, C78, C80, C84, where C60 and C70 are preferred due to higher yield during synthesis. It is also expected that the invention will work with derivatives of fullerenes such as Phenyl-C61-butyric acid methyl ester (PCBM) and similars.

Typical examples of doped electron transport materials are: fullerene C60 doped with acridine orange base (AOB); perylene-3,4,9,10-tetracarboxylic-3,4,9,10-dianhydride (PTCDA) doped with leuco crystal violet; 2,9-di(phenanthren-9-yl)-4,7-diphenyl-1,10-phenanthroline doped with tetrakis(1,3,4,6,7,8-hexahydro-2H-pyrimido [1,2-a]pyrimidinato) ditung-sten (II) (W2(hpp)4); naphthalene tetracarboxylic acid di-anhydride (NTCDA) doped with 3,6-bis-(dimethyl amino)-acridine; BPhen doped with Cs; NTCDA doped with bis(ethylene-dithio)tetrathiafulvalene (SEDT-TTF).

For the purpose of examples, Cs was used to dope BPhen, because Cs is a strong dopant, however 2,9-di(phenanthren-9-yl)-4,7-diphenyl-1,10-phenanthroline doped with tetrakis (1,3,4,6,7,8-hexahydro-2H-pyrimido [1,2-a]pyrimidinato) ditungsten(II) (W2(hpp)4) could also be used instead.

Molecular dopants are preferred and covalent organic molecules are further preferred. The doping can also be provided by dopant precursors, which transform into dopants after activation, such dopants can be radical compounds (cf. US2005040390).

Electrodes:

Any conductive layer can be used as electrode, preferred electrode layers comprise metal, TCOs, degenerated semiconductors (semiconductors which are heavily doped and therefore conductive), conductive polymers, etc.

Figure 1:
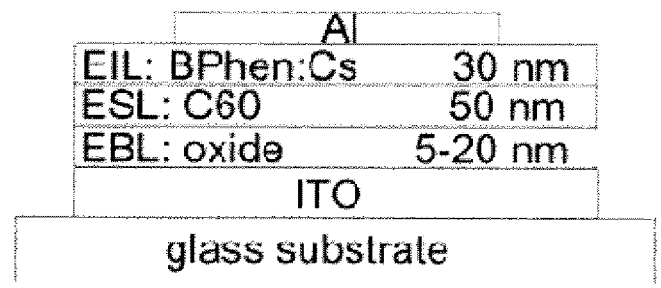
FIG. 1 Memory element design.

FIG. 1 shows a stack of layers which defines a memory element over a substrate. The materials of the layers are only exemplary. In this example, a glass substrate is used, over which an ITO layer forms the electrode, an Oxide layer (EBL), and electron storage layer of $C_{60}$ as electrically undoped layer, a Cs doped BPhen layer as electrically doped layer, and an Al layer as counter electrode.

Figure 10:
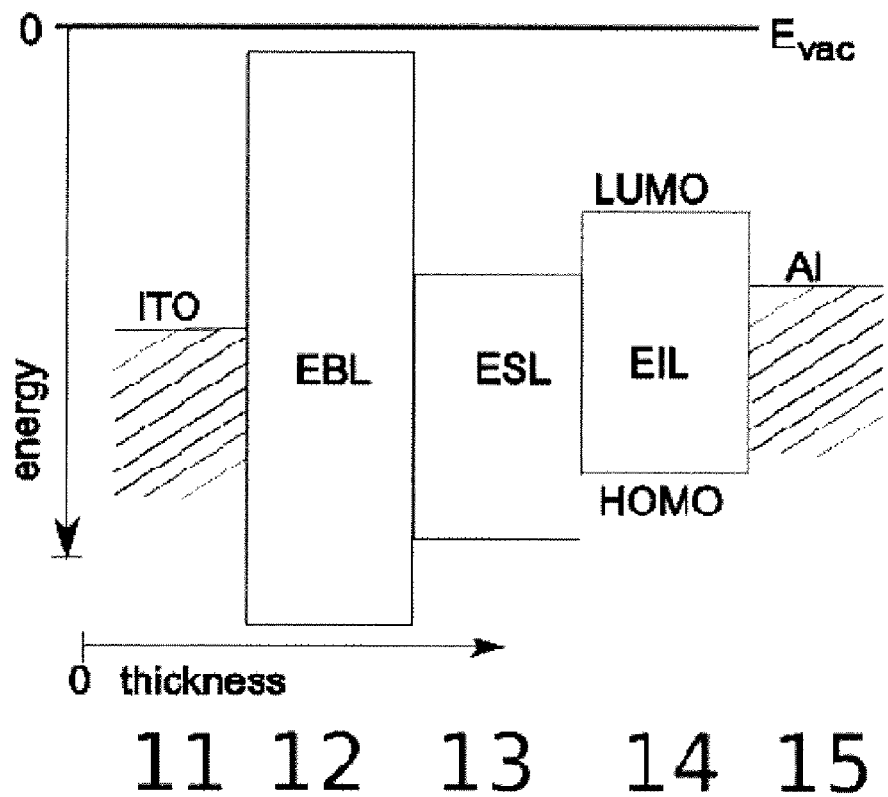
FIG. 10 Presentation of the energy level in the exemplary embodiment.

The layer sequence of an organic memory element is illustrated in FIGS. 10 and 11. An electrode (which can be ITO but could also be a metal or another conductor), an oxide layer adjacent to the electrode, which oxide layer has the function of an electron blocking layer, an electrically undoped organic layer as electron storage layer over the oxide layer, an electrically doped layer as an electron injection layer over the electrically undoped layer, and a counter-electrode. FIG. 10 shows a structure with the preferably useable energy level, where the LUMO of the oxide layer is the highest and the LUMO of the electrically undoped layer the lowest amongst the oxide layer, the electrically undoped organic layer, and the electrically doped organic layer.

Figure 12:
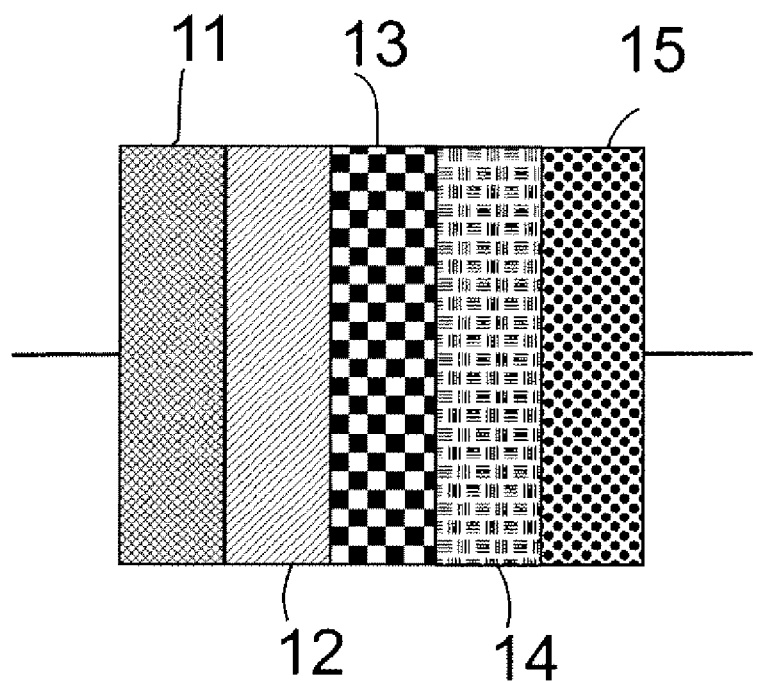
FIG. 12 Layer sequence of the exemplary embodiment of the organic memory element.

The following exemplary embodiment is illustrated in FIG. 12. A 10 nm thin SiO2 layer (electron blocking layer, EBL) (12) applied by sputtering is located on a glass substrate pre-structured with indium tin oxide (ITO) (11). This is followed by a 100 nm molecular layer of the material C60 (Electron Storage Layer, ESL) (14). A BPhen layer doped with 30 nm Cs (Electron Injection Layer, ESL) (14) facilitates an effective injection of electrons in the 100 nm thin aluminium cover contact (15). ITO serves as the anode, the aluminium cover contact as the electrode. A positive voltage is applied to the ITO contact, i.e. electrons are injected via the metal contact into the memory element.

The work function of ITO is −4.8 eV (11). The interval between the conduction band and the valence band of SiO2 is 9.0 eV (12), the LUMO (lowest unoccupied molecular orbital) of C60 is −3.8 eV and the HOMO (highest unoccupied molecular orbital) is −6.0 eV (13), the LUMO of BPhen is −6.7 eV and the HOMO is −3.8 eV (14), the work function of Al is −4.3 eV (15).

Figure 2:
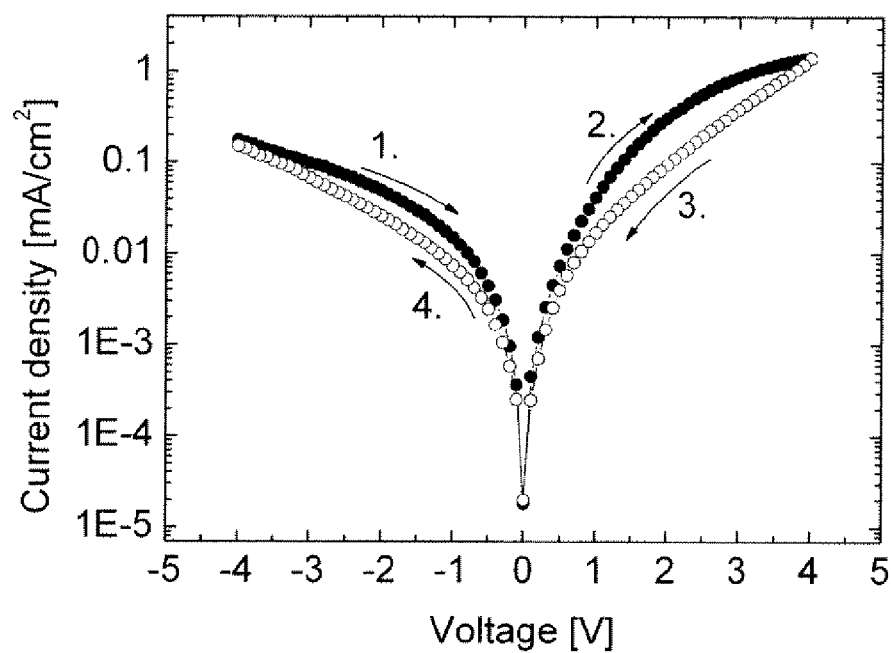
FIG. 2 IV characteristic curve of the organic memory with C60 as the organic material.

In FIG. 2 the IV characteristic curve of the memory element is represented for the case in which HfO2 is used as the oxide and indicates the course of the measurement with arrows. If the voltage is increased from −4 V to 4 V and then lowered again to −4 V, the shape of the current measuring curve displays hysteresis across the entire voltage range. The ratio of the current from the upper and lower branch at a voltage of 1 V (on/off ratio) is up to one order of magnitude.

Hysteresis can be observed with all oxides used. The oxides include HfO2 and SiO2. Work with Al2O3 as the oxide with thicknesses of between 3 nm, 5 nm and 7 nm, which were, however, deposited using an ALD process, likewise display hysteresis in the IV characteristic curves of the structures. The oxide layer may consist of a metal oxide, a transitional metal oxide or a semi-metal oxide.

The oxide thickness may vary between 10 and 50 nm. At an oxide thickness of over 50 inn, hysteresis can no longer be reliably detected in the characteristic curves. An optimum in relation to the greatest possible ON/OFF ratio is in the range between 10 and 20 nm.

The thickness of the C60 layer has been varied between 10 nm and 300 nm. The thickness of the C60 layer has scarcely any influence on the size of the ON/OFF ratio. The optimum C60 layer thickness is between 50 nm and 100 nm.

Figure 6:
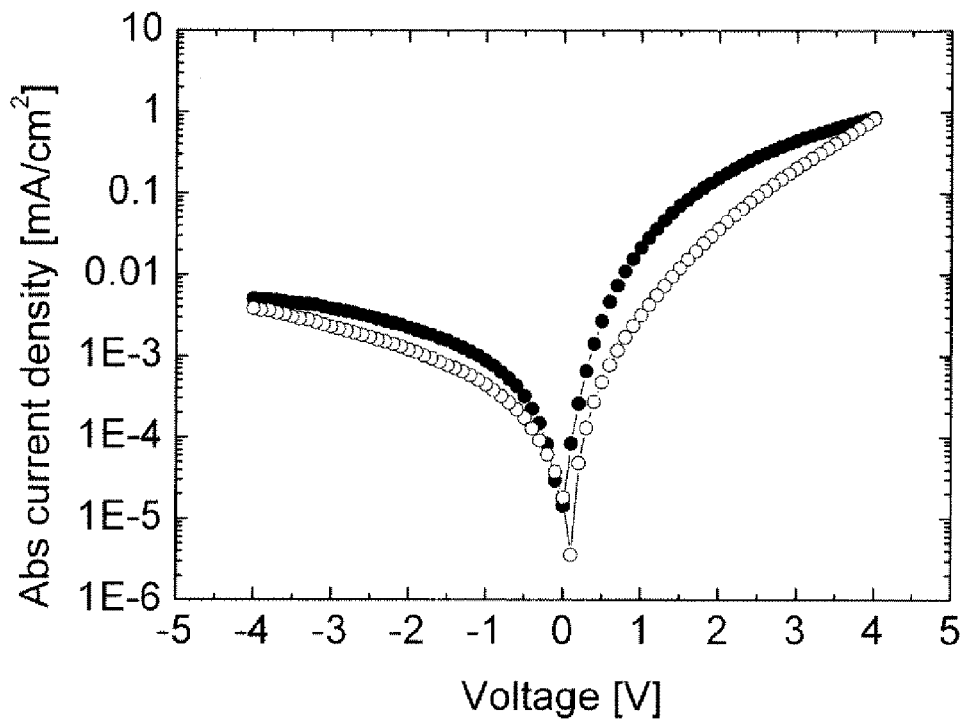
FIG. 6 IV characteristic curve of the organic memory with C70 as the organic material.
Figure 7:
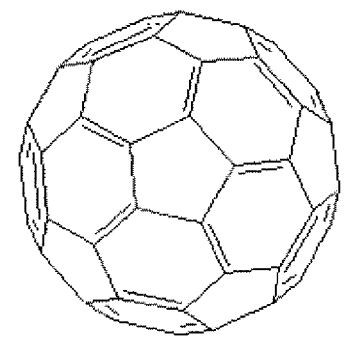
FIG. 7 C60 structure.
Figure 8:
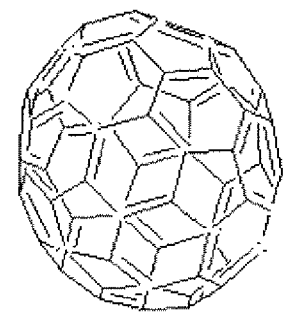
FIG. 8 C70 structure.
Figure 9:
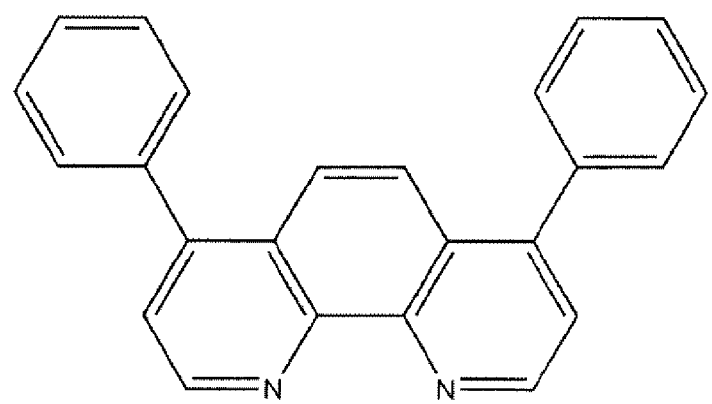
FIG. 9 Structure of bathophenanthroline; 4,7-diphenyl-1,10-phenanthroline (BPhen).

It was established that alongside C60 the C70 fullerene (see FIG. 6 for IV characteristic curve, see FIG. 8 for C70 molecule) can also be used as the organic layer in the memory design. It is assumed that all other fullerene-containing substances can be used instead of C60.

The organic layer may consist of a fullerene-containing material or an organic or inorganic compound containing fullerene.

The influence of the organic material on the memory effect was also investigated on Alq3, MePTCDi and pentacene, in addition to C60 and C70. Using the three aforementioned organic substances, either a small hysteresis with far higher voltages (pentacene) or no hysteresis (MePTCDi, Alq3) could be shown in the characteristic curves.

Figure 3:
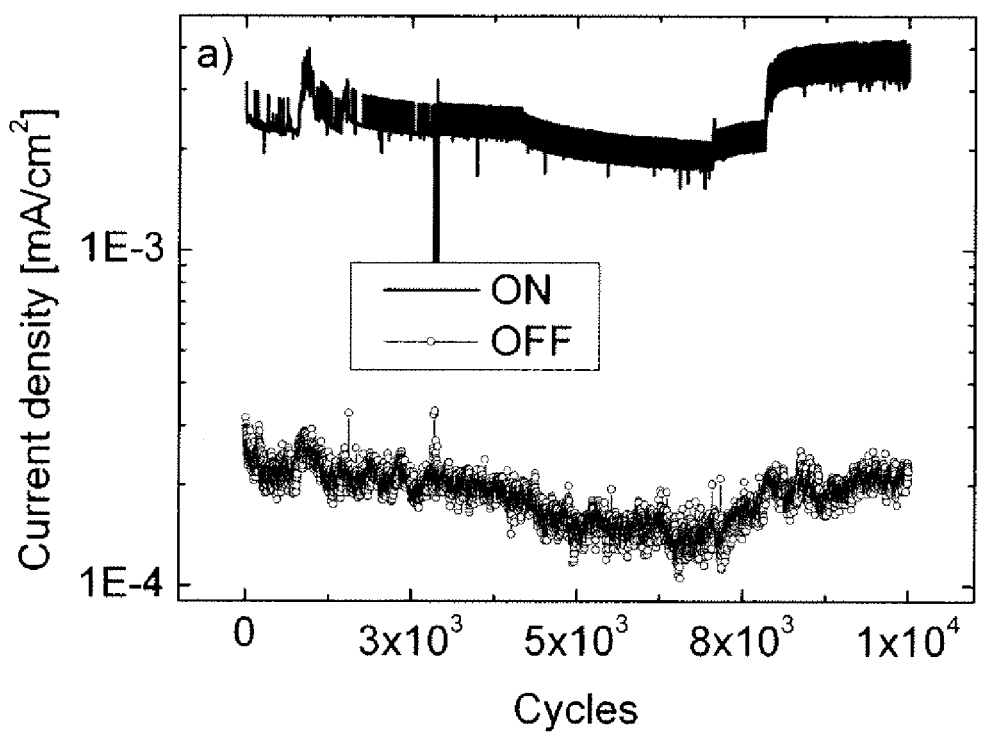
FIG. 3 Cycle stability for 104 cycles.

The results of a cycle stability measurement in the organic memory element are shown in FIG. 3. A sequence from write (4 V) read (1 V) delete (−4 V) read voltages (1 V) was conducted ten thousand times consecutively and the read currents for the on- and off-state for each cycle recorded. The readout currents for both states can still be clearly assigned to one of the two states after ten thousand completed switching cycles. The ratio of the readout currents for the on- and off-state is one order of magnitude over the duration of the cycle measurement. The shortest switch time for the organic memory is 50×10-6 s.

Figure 4:
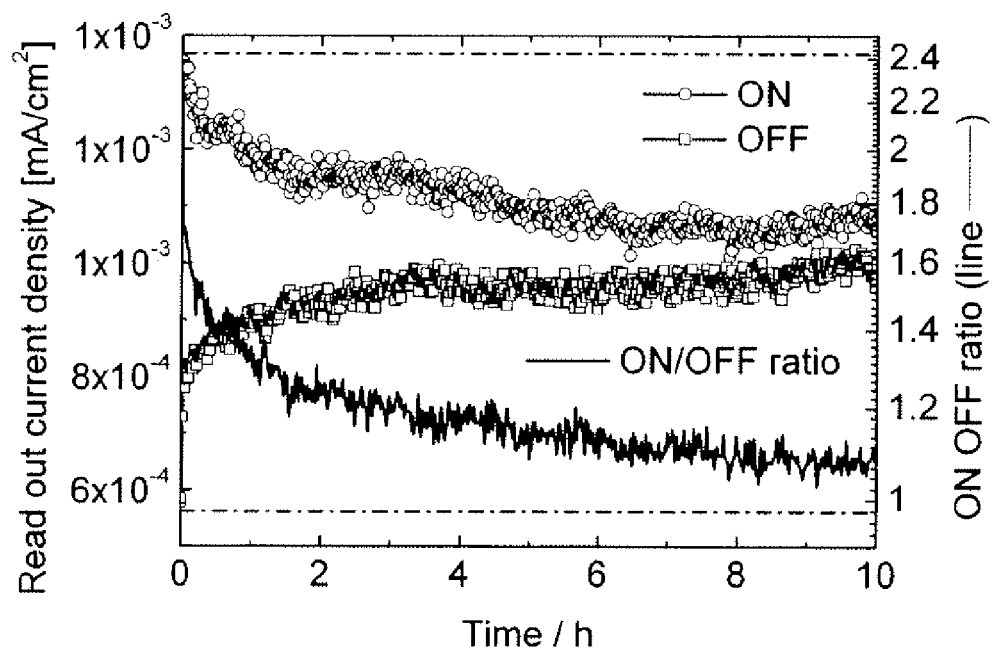
FIG. 4 Memory element data storage. Readout of the ON or OFF current at 1 V at 60 sec intervals.
Figure 5:
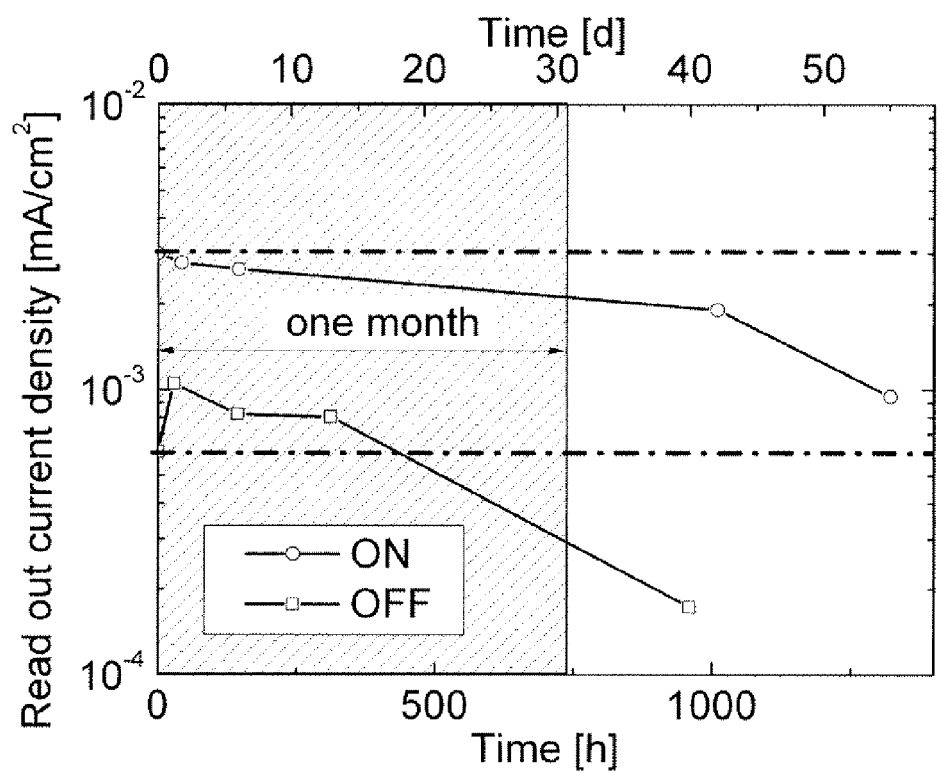
FIG. 5 Memory element data storage. Random readout of the ON or OFF current at 1 V. Random readout facilitates longer data storage.

The data storage in the memory element is illustrated in FIG. 4. The memory element was read out in the on- and off-state at 60 s intervals at 1 V and represented over time. An initially written state (on or off) can be clearly read out for up to 3 h. If the readout interval is increased, the data storage time can be further increased. If the readout takes place at time intervals of several days, the data storage time may be approx. 1 week or more (see FIG. 5).

Figure 20:
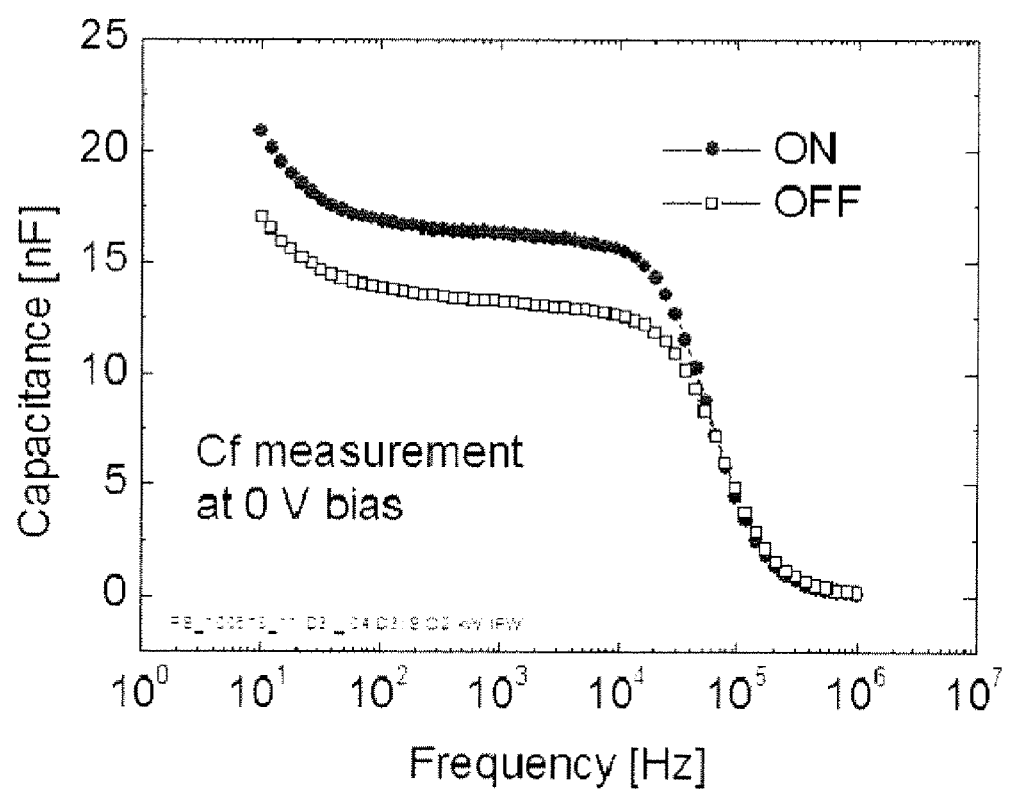
FIG. 20 Capacity-frequency measurement of the organic memory device for on and off state. The memory device comprises BPhen:Cs as doped layer and C60 as organic material.

The transition from the on to the off state could be demonstrated with the aid of capacity frequency investigations in a change of capacity of the organic memory (see FIG. 20). In capacity voltage measurements, capacity hysteresis in the range −4 V to 4 V is observed.

The change in capacity during the transition from the on- to the off-state and also the capacity hysteresis as a function of the voltage may be attributed to the charging and discharging of the memory element. The organic memory element claimed here is therefore in charge-based memories for electrons. The interface between the oxide and C60 plays a central role for the functional mechanism of the organic memory element represented here. If the oxide is replaced by an organic layer, which satisfies the condition (EOrganic layer instead of oxide>Eorg.,undop), no hysteresis can be observed in the IV characteristic curves and no memory effect is achieved.

Figure 13:
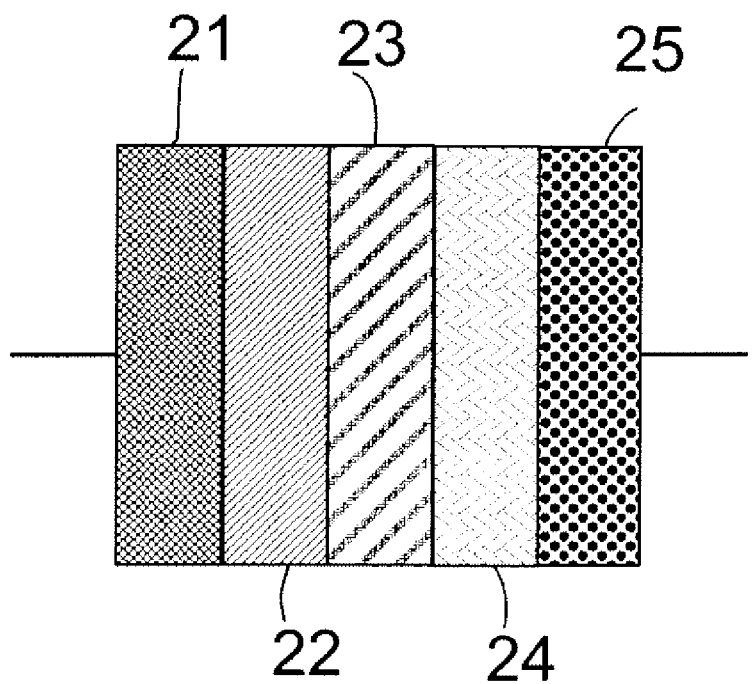
FIG. 13 Layer sequence in the exemplary embodiment of the organic storage element for holes as charge carriers.

The organic memory element presented here is based on electrons as the charge carrier type. The functional principle may also be applied with holes as charge carriers. With a suitable, hole-conducting, organic layer and a p-doped electrical layer, the memory principle can be transferred to holes. The layer sequence of a hole-based organic memory element is depicted in FIG. 13. On a base electrode (21) there is a particularly suitable oxide layer, which is able to store holes as charge carriers in trapping states (22), followed by a suitable organic layer (23), followed by a p-doped organic layer (24) as the hole injection layer in the organic memory component and a cathode material (25).

Figure 17:
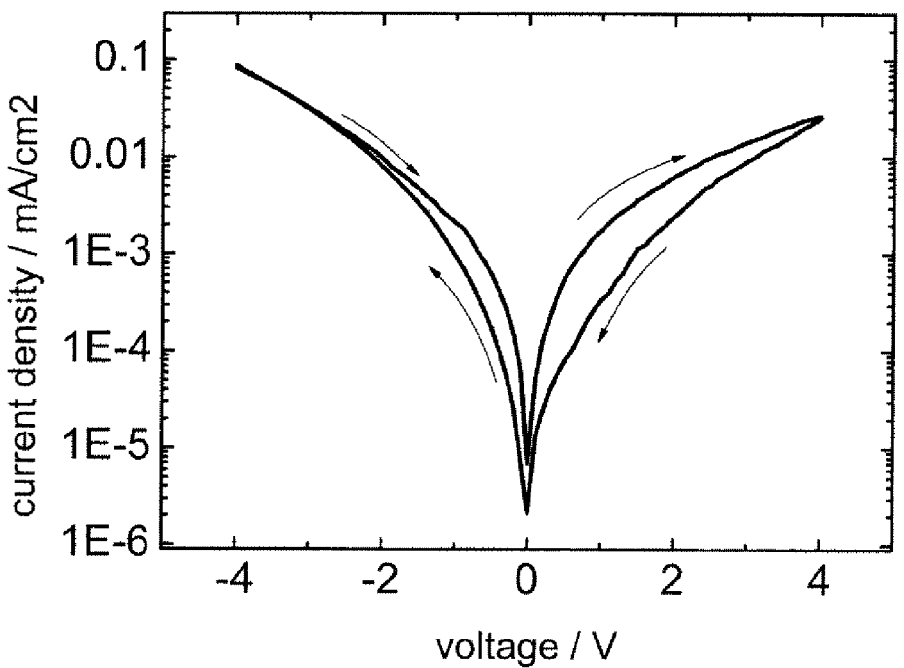
FIG. 17 IV characteristic curve of the organic memory with C60 and BPhen as the organic material. The BPhen layer is inserted between the C60 layer and the n doped BPhen:Cs.

Additional Buffer Layer Between Doped Layer and $C_{60}$:

An additional organic layer between doped layer and C60 suppresses Cs diffusion from the n doped layer into C60 layer. The device (FIG. 17) shows a hysteresis in its characteristics. This proves that possible Cs diffusion is not responsible for the appearance of hysteresis in organic memory device.

Use of Organic Materials Other than Fullerenes

Example 1

MePTCDi

Figure 14:
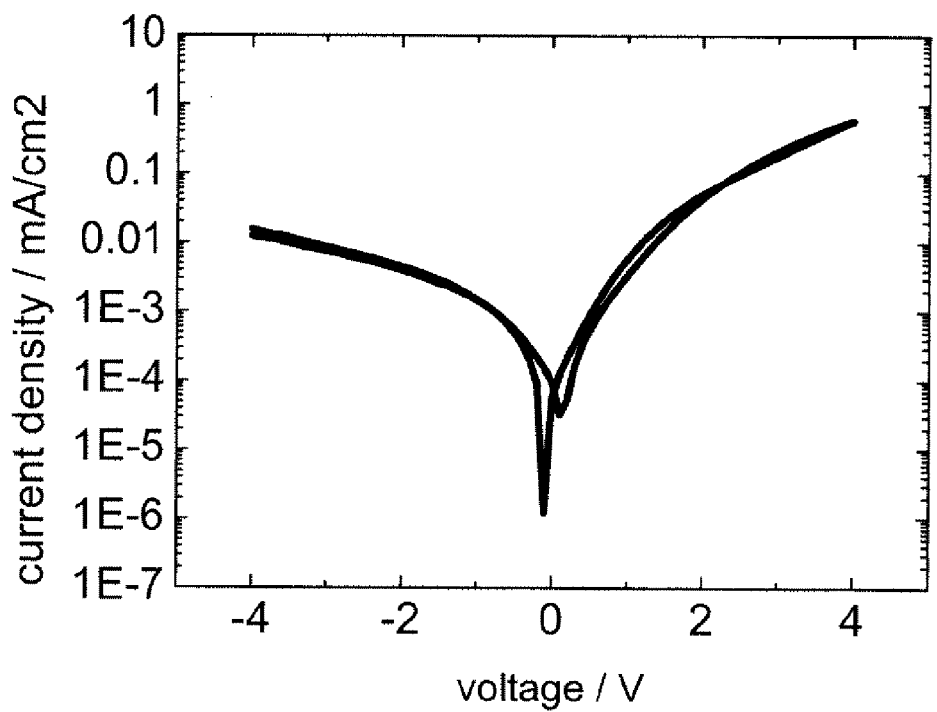
FIG. 14 IV characteristic curve of the organic memory with MePTCDi as the organic material.

No hysteresis is observed using MePTCDi as organic material instead of C60. FIG. 14 shows the characteristics of the sample with MePTCDi. The ON/OFF ratio of the sample is almost unity.

Example 2

Alq3

Figure 15:
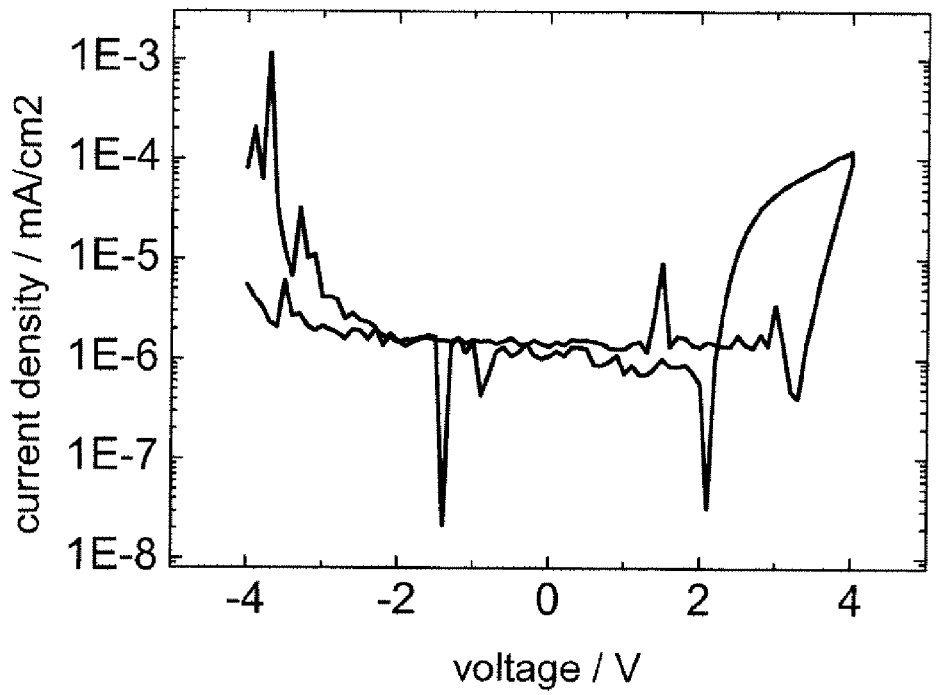
FIG. 15 IV characteristic curve of the organic memory with Alq3 as the organic material.

No hysteresis is observed using Alq3 as organic material instead of C60. FIG. 15 shows the characteristics of the sample with Alq3. The ON/OFF ratio can not be clearly defined.

Example 3

Pentacene

Figure 16:
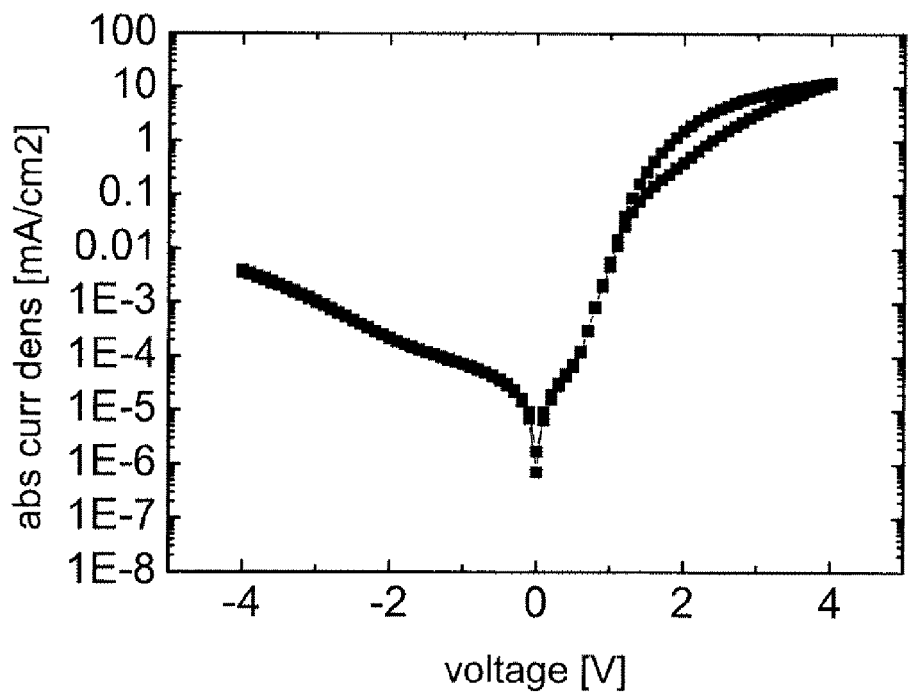
FIG. 16 IV characteristic curve of the organic memory with Pentacene the organic material.

A small hysteresis at higher voltages is observed using Pentacene as organic material instead of C60. FIG. 16 shows the characteristics of the sample with Pentacene. The ON/OFF ratio for low voltages (belay 2 V) can not be defined.

Different N-Dopant Materials

Example 1

W2(hpp)4:TPPhen

Figure 18:
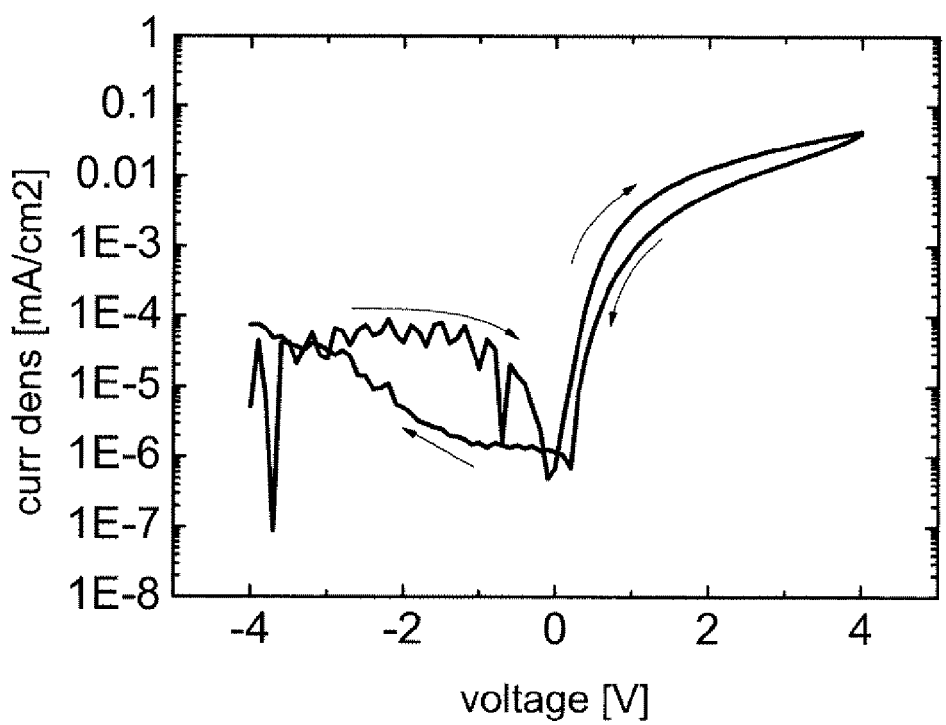
FIG. 18 IV characteristic curve of the organic memory with W2(hpp)4:2,4,7,9-tetraphenyl-1,10-phenanthroline doped (TPPhen) as the doped injection layer.

FIG. 18 shows the IV curve of the organic memory device. In this case TPPhen is doped by W2(hpp)4 and act as charge injection layer. A hysteresis is visible Example 2

W2(hpp)4:C60

Figure 19:
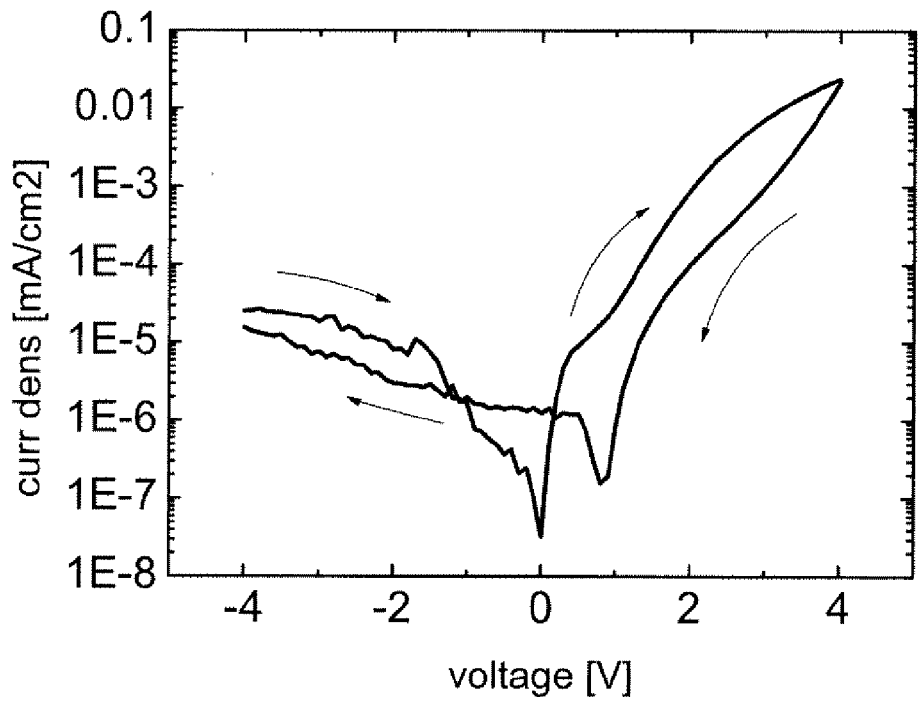
FIG. 19 IV characteristic curve of the organic memory with W2(hpp)4:C60 as the doped injection layer.

FIG. 19 shows the IV curve of the organic memory device. In this case C60 is doped by W2(hpp)4 and act as charge injection layer. A hysteresis is visible.

REFERENCES

[1] Scott, Bozano, Adv. Mater. 19, 1452 (2007)
[2] Naber et al, Adv. Mater. 21, 933 (2009)
[3] Tu et al, IEEE Electron Device Lett, 27, 354 (2006)
[4] Potember et al, Appl. Phys. Lett. 34, 405 (1979)
[5] Lindner et al. Appl. Phys. Lett., 93, 233305 (2008)
[6] Walzer et al. Chem. Rev. 107, 1233 (2007)

The invention claimed is:

1. An organic memory element comprising an electrode, a counter-electrode, and a stack of layers arranged between the electrode and the counter electrode, wherein the stack of layers consists of an oxide layer, an electrically undoped organic layer, and an electrically doped organic layer, wherein the oxide layer is arranged adjacent to the electrode and the electrically undoped organic layer, and wherein the interface of the electrically undoped organic layer with the oxide layer is capable of storing charges, wherein the charges alter the element's electrical conductivity and are produced via the electrically doped organic layer.

2. The organic memory element according to claim 1, wherein the electrically doped organic layer comprises an electrically conductive layer capable of introducing injected charge carriers into the element.

3. The organic memory element according to claim 1, wherein the electrically undoped organic layer and the electrically doped organic layer comprise a fullerene compound.

4. The organic memory element according to claim 1, wherein the electrically undoped organic layer and the electrically doped organic layer comprise fullerene or a fullerene derivative.

5. The organic memory element according to claim 4, wherein the fullerene comprises $C_{60}$ or $C_{70}$.

6. The organic memory element according to claim 1, wherein the one oxide layer comprises a metal oxide, a transitional metal oxide, or a semi-metal oxide.

7. The organic memory element according to claim 1, wherein the oxide layer comprises $Al_2O_3$, $SiO_2$, or $HfO_2$.

8. An organic memory element comprising an electrode, a counter electrode, and a stack of layers arranged between the electrode and the counter electrode, wherein the stack of layers consists of an oxide layer, an electrically undoped organic layer, an electrically doped organic layer, and a buffer layer, wherein the oxide layer is arranged adjacent to the electrode and the electrically undoped layer, and wherein the buffer layer is arranged between the electrically doped organic layer and the electrically undoped layer.

* * * * *